(12) United States Patent
Feng et al.

(10) Patent No.: US 12,507,546 B2
(45) Date of Patent: Dec. 23, 2025

(54) DISPLAY PANEL AND DISPLAY APPARATUS (71) Applicants: Chengdu BOE Optoelectronics Technology Co., Ltd., Sichuan (CN); BOE Technology Group Co., Ltd., Beijing (CN)

(72) Inventors: Lei Feng, Beijing (CN); Zhiguang Zhang, Beijing (CN); Huatao Li, Beijing (CN); Jianhang Fu, Beijing (CN)

(73) Assignees: Chengdu BOE Optoelectronics Technology Co., Ltd., Sichuan (CN); Beijing BOE Technology Group Co., Ltd., Beijing (CN)

( * ) Notice: Subject to any disclaimer, the term of this patent is extended or adjusted under 35 U.S.C. 154(b) by 686 days.

(21) Appl. No.: 17/796,955

(22) PCT Filed: Oct. 22, 2021

(86) PCT No.: PCT/CN2021/125846
§ 371 (c)(1),
(2) Date: Aug. 2, 2022

(87) PCT Pub. No.: WO2022/156290
PCT Pub. Date: Jul. 28, 2022

(65) Prior Publication Data
US 2023/0072807 A1 Mar. 9, 2023

(30) Foreign Application Priority Data
Jan. 22, 2021 (CN) .......................... 202110093610.0

(51) Int. Cl.
*H10K 59/131* (2023.01)
(52) U.S. Cl.
CPC ................................. *H10K 59/131* (2023.02)

(58) Field of Classification Search
None
See application file for complete search history.

(56) References Cited

U.S. PATENT DOCUMENTS

2008/0054802 A1* 3/2008 Cok ...................... H10K 50/865
313/506
2010/0171738 A1 7/2010 Yamashita et al.
(Continued)

FOREIGN PATENT DOCUMENTS

CN 103413517 A 11/2013
CN 105633297 A 6/2016
(Continued)

OTHER PUBLICATIONS

CN202110093610.0 first office action.
CN202110093610.0 Decision of Rejection.

*Primary Examiner* — Michael Lebentritt
(74) *Attorney, Agent, or Firm* — IPro, PLLC (57) ABSTRACT A display panel includes: a transparent substrate with a display area including a light-emitting area and a non-light-emitting area; a light-emitting device on the transparent substrate, where the light-emitting device includes a first transparent electrode layer, a light-emitting functional layer and a second transparent electrode layer; the light-emitting functional layer includes light-emitting parts arranged in an array, and the light-emitting parts are in the corresponding light-emitting area; a driving structure between the transparent substrate and the light-emitting device, where the driving structure includes pixel circuits arranged in an array and a power supply line electrically connected to the pixel circuits to provide a power voltage, the pixel circuits are configured to drive the light-emitting parts to emit light; and orthographic projections of the pixel circuits and the power supply line on the transparent substrate are all located within (Continued)

an orthographic projection range of the non-light-emitting area on the transparent substrate.

11 Claims, 6 Drawing Sheets

(56) References Cited

U.S. PATENT DOCUMENTS

| | | |
|---|---|---|
| 2010/0245308 A1 | 9/2010 | Takei |
| 2016/0149156 A1 | 5/2016 | Kim et al. |
| 2018/0013086 A1 | 1/2018 | Chou et al. |
| 2019/0067396 A1 | 2/2019 | Cheng et al. |
| 2021/0134877 A1* | 5/2021 | Kim ................... H10H 29/142 |

FOREIGN PATENT DOCUMENTS

| | | | |
|---|---|---|---|
| CN | 108063152 A | 5/2018 | |
| CN | 108336107 A | 7/2018 | |
| CN | 110289299 A | 9/2019 | |
| CN | 110299469 A | 10/2019 | |
| CN | 112310153 A * | 2/2021 | ........... G09G 3/2003 |
| CN | 112885978 A | 6/2021 | |
| GB | 2434686 A * | 8/2007 | ........... G09G 3/3688 |
| JP | 6688701 B2 * | 4/2020 | ........... H01L 27/322 |
| WO | WO-2016060089 A1 * | 4/2016 | ......... H01L 27/3248 |
| WO | WO-2021070236 A1 * | 4/2021 | ......... H01L 27/3218 |

* cited by examiner

DISPLAY PANEL AND DISPLAY APPARATUS

CROSS-REFERENCE OF RELATED APPLICATIONS

The disclosure is a national phase entry under 35 U.S.C. § 371 of International Application No. PCT/CN2021/125846, filed on Oct. 22, 2021, which claims the priority to Chinese Patent Application No. 202110093610.0, filed with the China National Intellectual Property Administration on Jan. 22, 2021 and entitled "Display Panel and Display Apparatus", the entire content of which is hereby incorporated by reference.

FIELD

The disclosure relates to the field of display technology, and in particular, to a display panel and a display apparatus.

BACKGROUND

The Active-Matrix Organic Light Emitting Diode (AMOLED) is a new generation of display technology, has the advantages of self-illumination, wide viewing angle, high contrast and flexible display realized by bending (winding), and has become the preferred display screen of terminal giants. In recent years, with the increasingly diversified application scenarios of electronic terminal products, the double-sided visualization function has also been demanded by consumers. For example, in the window industry of some public places such as bank counter, government window, financial industry and transportation industry, with the double-sided visualization function, the service efficiency of the service window can be greatly improved, and the transparency of the service can be increased.

However, most of the current AMOLED double-sided display devices use a design scheme of back-to-back installation of two independent display devices. The process of this design method is complicated and cumbersome, and each film layer of the light-emitting device needs to be fabricated in duplicate. The fabrication cost is high and the energy consumption is serious, and the cost performance is low, which do not meet the consumers' expectations for the thin and light display screen.

BRIEF SUMMARY

A display panel according to embodiments of the disclosure includes:

a transparent substrate with a display area including a light-emitting area and a non-light-emitting area around the light-emitting area;

a light-emitting device located on the transparent substrate, where the light-emitting device includes a first transparent electrode layer, a light-emitting functional layer and a second transparent electrode layer arranged in sequence; the light-emitting functional layer includes a plurality of light-emitting parts arranged in an array, and the plurality of light-emitting parts are located in the corresponding light-emitting area;

a driving structure located between the transparent substrate and the light-emitting device, where the driving structure includes a plurality of pixel circuits arranged in an array and a power supply line electrically connected to the pixel circuits to provide a power voltage, the pixel circuits are configured to drive the corresponding light-emitting parts to emit light; and orthographic projections of the pixel circuits and the power supply line on the transparent substrate are all located within an orthographic projection range of the non-light-emitting area on the transparent substrate.

Optionally, in the above-mentioned display panel according to the embodiments of the disclosure, the first transparent electrode layer is a fully-transparent or semi-transparent electrode layer, and the second transparent electrode layer is a fully-transparent or semi-transparent electrode layer.

Optionally, in the above-mentioned display panel according to the embodiments of the disclosure, material of the first transparent electrode layer includes Indium Tin Oxide (ITO), Indium Zinc Oxide (IZO), Indium Gallium Oxide (IGO), Gallium Zinc Oxide (GZO), Zinc Oxide (ZnO), Indium Oxide ($In_2O_3$), Aluminum Zinc Oxide (AZO) or carbon nanotube; and material of the second transparent electrode layer includes Indium Tin Oxide (ITO), Indium Zinc Oxide (IZO), Indium Gallium Oxide (IGO), Gallium Zinc Oxide (GZO), Zinc Oxide (ZnO), Indium Oxide ($In_2O_3$), Aluminum Zinc Oxide (AZO) or carbon nanotube.

Optionally, the above-mentioned display panel according to the embodiments of the disclosure further includes a pixel defining layer with pixel openings in a one-to-one correspondence to the light-emitting areas, where the orthographic projections of the pixel circuits and the power supply line on the transparent substrate are all located within an orthographic projection range of the pixel defining layer on the transparent substrate.

Optionally, in the above-mentioned display panel according to the embodiments of the disclosure, the first transparent electrode layer is located between the driving structure and the light-emitting functional layer, the first transparent electrode layer is an anode layer, and the second transparent electrode layer is a cathode layer.

The light-emitting part includes: a light-emitting layer, at least one of a hole injection layer and a hole transport layer between the first transparent electrode layer and the light-emitting layer, and at least one of a hole blocking layer, an electron transport layer and an electron injection layer between the light-emitting layer and the second transparent electrode layer.

Optionally, in the above-mentioned display panel according to the embodiments of the disclosure, a transmittance of the first transparent electrode layer is 88%-94%, a transmittance of the second transparent electrode layer is 88%-94%, a transmittance of the electron injection layer is 80%-92%, a transmittance of the electron transport layer is 80%-92%, a transmittance of the hole blocking layer is 75%-90%, a transmittance of the hole transport layer is 75%-90%, and a transmittance of the hole injection layer is 75%-90%.

Optionally, the above-mentioned display panel according to the embodiments of the disclosure further includes a heat dissipation protective layer on a side of the transparent substrate facing away from the light-emitting device.

Optionally, in the above-mentioned display panel according to the embodiments of the disclosure, the heat dissipation protective layer is provided with an opening area corresponding to the light-emitting area.

Optionally, in the above-mentioned display panel according to the embodiments of the disclosure, the driving structure further includes: a gate line, and a data line crossed with the gate line;

the power supply line and the gate line are arranged crosswise, and the power supply line and the data line are arranged in a same layer.

Optionally, in the above-mentioned display panel according to the embodiments of the disclosure, the driving structure further includes: a gate line, and a data line crossed with the gate line;

the power supply line and the data line are arranged crosswise, and the power supply line and the gate line are arranged in a same layer.

Optionally, in the above-mentioned display panel according to the embodiments of the disclosure, the pixel circuit includes a switch transistor and a drive transistor, the gate line and the data line are both electrically connected to the corresponding switch transistor, and the power supply line is electrically connected to the drive transistor;

each of the switch transistor and the drive transistor includes a gate layer and a source-drain layer, the gate line is located in the gate layer, and the data line is located in the source-drain layer.

Optionally, in the above-mentioned display panel according to the embodiments of the disclosure, the transparent substrate is a glass substrate or a plastic substrate.

Optionally, the above-mentioned display panel according to the embodiments of the disclosure further includes a transparent encapsulation layer, located on a side of the light-emitting device away from the transparent substrate and covering the light-emitting device.

Correspondingly, embodiments of the disclosure further provide a display apparatus including the above-mentioned display panel.

Optionally, the above-mentioned display apparatus according to the embodiments of the disclosure further includes a transparent cover plate disposed opposite to the display panel. The transparent cover plate covers the display panel.

DETAILED DESCRIPTION OF THE EMBODIMENTS

In order to make the purposes, technical solutions and advantages of the disclosure clearer, the technical solutions of the embodiments of the disclosure will be described clearly and completely below in combination with the accompanying drawings of the embodiments of the disclosure. Obviously the described embodiments are a part of the embodiments of the disclosure but not all the embodiments. Also in the case of no conflict, the embodiments and the features therein in the disclosure can be combined with each other. Based upon the embodiments of the disclosure, all of other embodiments obtained by those ordinary skilled in the art without creative work pertain to the protection scope of the disclosure.

Unless otherwise defined, the technical or scientific terms used in the disclosure shall have the general meaning understood by those ordinary skilled in the art to which the disclosure belongs. The word such as "include" or "contain" or the like used in the disclosure means that the element or object appearing before this word encompasses the elements or objects and their equivalents listed after this word, without excluding other elements or objects. The word such as "connect" or "connected" or the like is not limited to the physical or mechanical connection, but can include the electrical connection, whether direct or indirect. The words such as "inner", "outer", "up", "down" are only used to represent the relative position relationship. When the absolute position of a described object changes, the relative position relationship may also change accordingly.

It is necessary to note that the size and shape of each diagram in the accompanying drawings do not reflect the true proportion, and are merely for purpose of schematically illustrating the content of the disclosure. Also, the same or similar reference numbers represent the same or similar elements or the elements having the same or similar functions all the way.

Figure 1:
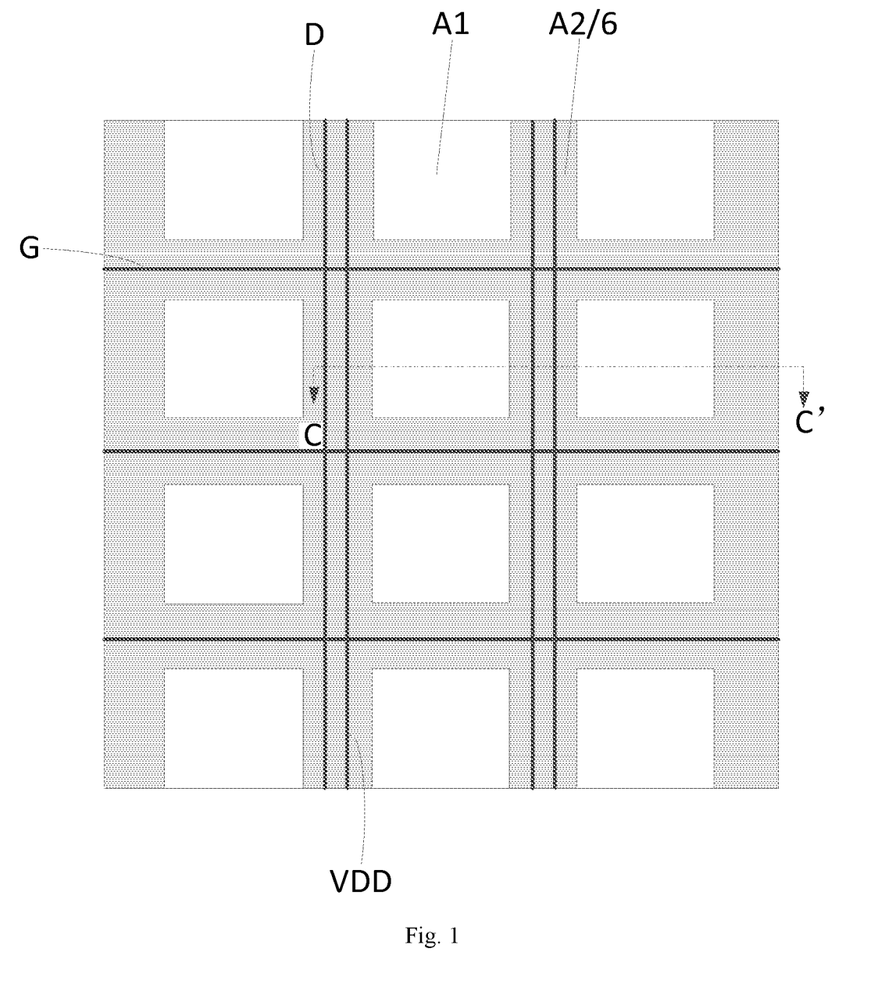
FIG. 1 is a structural schematic diagram of a top-view of a display panel according to an embodiment of the disclosure.
Figure 2:
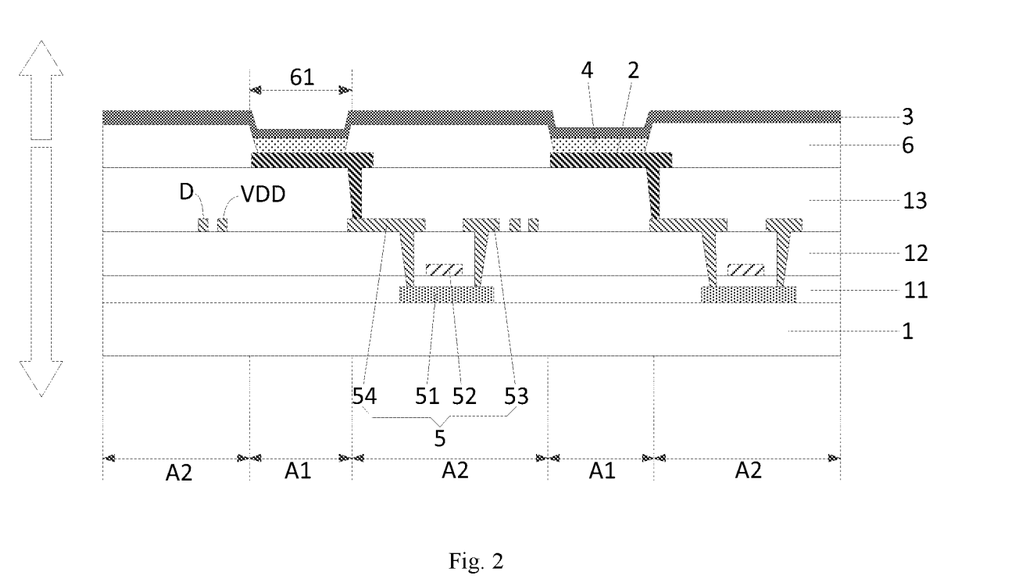
FIG. 2 is a cross-section schematic diagram along the direction CC' in FIG. 1.

A display panel according to embodiments of the disclosure is as shown in FIG. 1 and FIG. 2. FIG. 1 is a structural schematic diagram of a top-view of the display panel, and FIG. 2 is a cross-section schematic diagram along the direction CC' in FIG. 1.

The display panel includes:

a transparent substrate 1 with a display area including a light-emitting area A1 and a non-light-emitting area A2 around the light-emitting area A1; where the case that a plurality of light-emitting areas A1 are arranged at intervals and the non-light-emitting area A2 is located between the light-emitting areas A1 is taken as an example to illustrate in FIG. 1 of the embodiment of the disclosure, but not limited thereto;

a light-emitting device located on the transparent substrate 1, where the light-emitting device includes a first transparent electrode layer 2, a light-emitting functional layer and a second transparent electrode layer 3 arranged in sequence; the light-emitting functional layer includes a plurality of light-emitting parts 4 arranged in an array, and the plurality of light-emitting parts 4 are located in the corresponding light-emitting area A1;

a driving structure located between the transparent substrate 1 and the light-emitting device, where the driving structure includes a plurality of pixel circuits 5 arranged in an array and a power supply line VDD electrically connected to the pixel circuits 5 to provide a power voltage, the pixel circuits 5 are configured to drive the corresponding light-emitting parts 4 to emit light; and orthographic projections of the pixel circuits 5 and the power supply line VDD on the transparent substrate 1 are all located within an orthographic projection range of the non-light-emitting area A2 on the transparent substrate 1.

In the above-mentioned display panel according to the embodiments of the disclosure, the first transparent electrode layer 2 and the second transparent electrode layer 3 of the light-emitting device are both transparent electrodes, so the light-emitting device is a transparent light-emitting device, and the pixel circuit 5 of the driving structure can control the corresponding light-emitting device to emit light to one side of the first transparent electrode layer 2 and one side of the second transparent electrode layer 3 respectively, so that the display panel can realize the double-sided display, that is, realize the double-sided visualization performance of the screen of the display panel, further enriching the application scenarios of the AMOLED display technology. Also, since the orthographic projections of the pixel circuits 5 and the power supply line VDD on the transparent substrate 1 are all located within the orthographic projection range of the non-light-emitting area A2 on the transparent substrate 1, the pixel circuits 5 and the power supply line VDD do not occupy the aperture ratio of the display panel, increasing the luminous brightness of the display panel.

The display panel realizes the double-sided display, and the light needs to be emitted from both sides. The both sides here refer to a side where the transparent substrate of the display panel is located and a side where the cover plate to be fabricated later is located. In the embodiments of the disclosure, the side where the transparent substrate is located is called the back side, and the side where the cover plate is located is called the front side. Of course, they can be used interchangeably as required. The front side and the back side are only used to distinguish in the description, so that those skilled in the art can understand the inventive concept of the disclosure more clearly.

During specific implementations, in the above-mentioned display panel according to the embodiments of the disclosure, the first transparent electrode layer may be a fully-transparent or semi-transparent electrode layer, and the second transparent electrode layer may be a fully-transparent or semi-transparent electrode layer.

During specific implementations, in the above-mentioned display panel according to the embodiments of the disclosure, the material of the first transparent electrode layer may include Indium Tin Oxide (ITO), Indium Zinc Oxide (IZO), Indium Gallium Oxide (IGO), Gallium Zinc Oxide (GZO), Zinc Oxide (ZnO), Indium Oxide ($In_2O_3$), Aluminum Zinc Oxide (AZO) or carbon nanotube; and the material of the second transparent electrode layer may include Indium Tin Oxide (ITO), Indium Zinc Oxide (IZO), Indium Gallium Oxide (IGO), Gallium Zinc Oxide (GZO), Zinc Oxide (ZnO), Indium Oxide ($In_2O_3$), Aluminum Zinc Oxide (AZO) or carbon nanotube.

The material of the first transparent electrode layer and the material of the second transparent conductive layer are not limited to the materials listed above, and may also include other transparent or semi-transparent conductive materials.

During specific implementations, in the above-mentioned display panel according to the embodiments of the disclosure, the second transparent electrode layer may preferably be a semi-transparent electrode layer. Since the semi-transparent electrode layer has a certain reflection effect, it can make the front and back sides of the display panel emit light evenly and make the light transmittances of the front and back sides of the display panel as consistent as possible.

During specific implementations, in the above-mentioned display panel according to the embodiments of the disclosure, as shown in FIG. 1 and FIG. 2, the pixel circuit 5 includes a switch transistor (not shown) and a drive transistor (5), the gate line G and the data line D are both electrically connected to the corresponding switch transistor, and the power supply line VDD is electrically connected to the drive transistor 5.

Each of the switch transistor and the drive transistor 5 includes a gate layer (52) and a source-drain layer (53, 54), the gate line G is located in the gate layer (52), and the data line D is located in the source-drain layer (53, 54).

During specific implementations, in the above-mentioned display panel according to the embodiments of the disclosure, the pixel circuit may be the 7T1C structure commonly used at present, that is, including six switch transistors, one drive transistor and one capacitor. In the embodiment of the disclosure, FIG. 1 only illustrates one drive transistor (i.e., 5) in the pixel circuit 5. The drive transistor includes an active layer 51, a gate layer 52, a source 53 and a drain 54 on the transparent substrate 1, and the drain 54 is electrically connected to the first transparent electrode layer 2.

During specific implementations, the above-mentioned display panel according to the embodiments of the disclosure, as shown in FIG. 2, further includes: a gate insulating layer 11 between the active layer 51 and the gate layer 52, an interlayer insulating layer 12 between the gate layer 52 and the source 53 and drain 54, and a planar layer 13 between the source 53 and drain 54 and the first transparent electrode layer 2.

During specific implementations, the above-mentioned display panel according to the embodiments of the disclosure, as shown in FIG. 1 and FIG. 2, further includes: a pixel defining layer 6 with pixel openings 61 in a one-to-one correspondence to the light-emitting areas A1. The orthographic projections of the pixel circuits 5 and the power supply line VDD on the transparent substrate 1 are all located within an orthographic projection range of the pixel defining layer 6 on the transparent substrate 1. Thus, the pixel circuits 5 and the power supply line VDD do not occupy the aperture ratio of the display panel, increasing the luminous brightness of the display panel.

At present, the electroluminescent devices can be divided into an upright structure and an inverted structure. The difference between the upright structure and the inverted structure is different fabrication sequences of the film layers.

Figure 3:
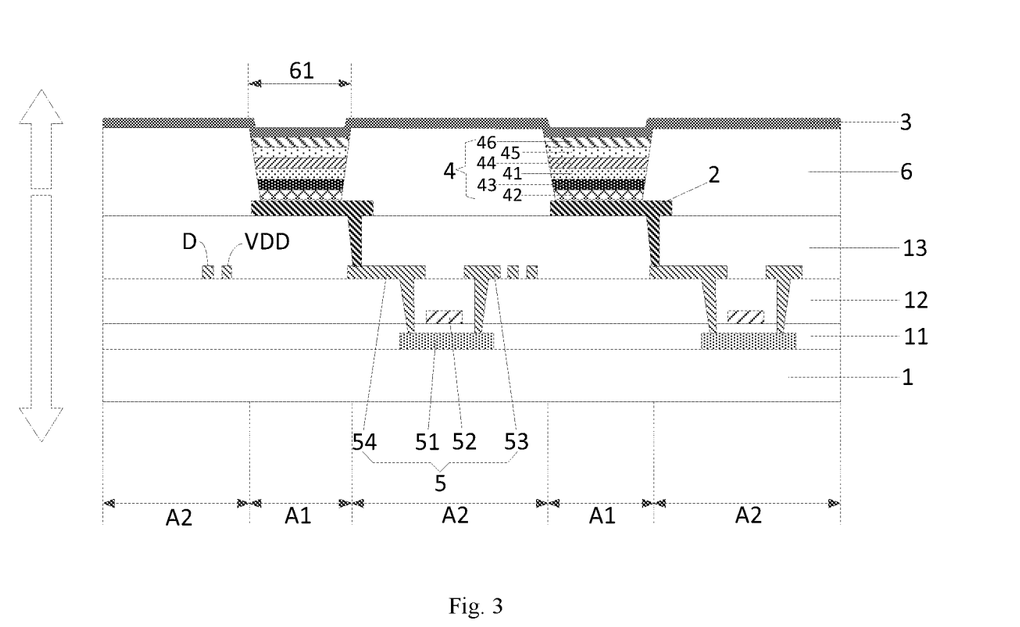
FIG. 3 is another cross-section schematic diagram along the direction CC' in FIG. 1.

During specific implementation, in the above-mentioned display panel according to the embodiments of the disclosure, as shown in FIG. 3, the light-emitting device in FIG. 3 is an upright structure. The first transparent electrode layer 2 is located between the driving structure and the light-emitting functional layer, the first transparent electrode layer 2 may be an anode layer and have a plurality of anodes arranged in a one-to-one correspondence to the light-emitting areas A1. The second transparent electrode layer 3 is a cathode layer which is arranged on the entire surface.

The light-emitting part 4 includes: a light-emitting layer 41, at least one of a hole injection layer 42 and a hole transport layer 43 between the first transparent electrode layer 2 and the light-emitting layer 41, and at least one of a hole blocking layer 44, an electron transport layer 45 and an electron injection layer 46 between the light-emitting layer 41 and the second transparent electrode layer 3.

FIG. 3 takes the light-emitting device being an upright structure as an example for illustration. The upright structure is to form an anode, a hole injection layer, a hole transport layer, a light-emitting layer, a hole blocking layer, an electron transport layer, an electron injection layer and a cathode sequentially on the substrate. Further, the light-emitting device may also be an inverted structure, which is to form a cathode, an electron injection layer, an electron transport layer, a hole blocking layer, a light-emitting layer, a hole transport layer, a hole injection layer and an anode sequentially on the substrate.

It should be noted that the light-emitting principle of the electroluminescent device is that the holes of the anode and the electrons of the cathode are transported to the light-emitting layer and combined to emit light. Due to the differences of energy level barrier between the anode and the light-emitting layer and between the cathode and the light-emitting layer, the electrons and holes are difficult to be transported and the transport rates and quantities are also very different. Therefore, in order to balance the concentration of electrons and holes, a hole injection layer and a hole transport layer are generally arranged between the light-emitting layer and the anode; and a hole blocking layer, an electron transport layer and an electron injection layer are generally arranged between the light-emitting layer and the cathode. Of course, which layers are required can be selected according to actual needs in specific implementations. In FIG. 3 of the embodiment of the disclosure, the light-emitting part 4 includes: a light-emitting layer 41, a hole injection layer 42 and a hole transport layer 43 between the first transparent electrode layer 2 and the light-emitting layer 41, and a hole blocking layer 44, an electron transport layer 45 and an electron injection layer 46 between the light-emitting layer 41 and the second transparent electrode layer 3, as an example for illustration.

During specific implementations, in the above-mentioned display panel according to the embodiments of the disclosure, as shown in FIG. 3, the transmittance of the first transparent electrode layer 2 may be 88%-94%, the transmittance of the second transparent electrode layer 3 may be 88%-94%, the transmittance of the electron injection layer 46 may be 80%-92%, the transmittance of the electron transport layer 45 may be 80%-92%, the transmittance of the hole blocking layer 44 may be 75%-90%, the transmittance of the hole transport layer 43 may be 75%-90%, and the transmittance of the hole injection layer 42 may be 75%-90%.

During specific implementations, in the above-mentioned display panel according to the embodiments of the disclosure, as shown in FIG. 1 to FIG. 3, the driving structure further includes: a gate line G, and a data line D crossed with the gate line G.

The power supply line VDD and the gate line are arranged crosswise, and the power supply line VDD and the data line D are arranged in a same layer. In this way, the original patterning only needs to be changed when the data line D is formed, that is, the pattern of the power supply line VDD and the data line D can be formed by one patterning process with no need to increase the process of preparing the power supply line VDD separately, thereby simplifying the preparation process, saving the production cost, and improving the production efficiency.

Alternatively, during specific implementations, in the above-mentioned display panel according to the embodiments of the disclosure, the driving structure further includes: a gate line, and a data line crossed with the gate line.

The power supply line and the data line may be arranged crosswise, and the power supply line and the gate line may be arranged in a same layer. In this way, the original patterning only needs to be changed when the gate line is formed, that is, the pattern of the power supply line and the gate line can be formed by one patterning process with no need to increase the process of preparing the power supply line separately, thereby simplifying the preparation process, saving the production cost, and improving the production efficiency.

It should be noted that the power supply line VDD and the gate line are arranged crosswise and the power supply line VDD and the data line D are arranged in the same layer as an example for illustration in FIG. 2 and FIG. 3 of the embodiment of the disclosure.

During specific implementations, in the above-mentioned display panel according to the embodiments of the disclosure, the transparent substrate may be a glass substrate or a plastic substrate. When the transparent substrate is a glass substrate, the display panel is a rigid display panel. When the transparent substrate is a plastic substrate, the display panel is a flexible display panel.

Figure 4:
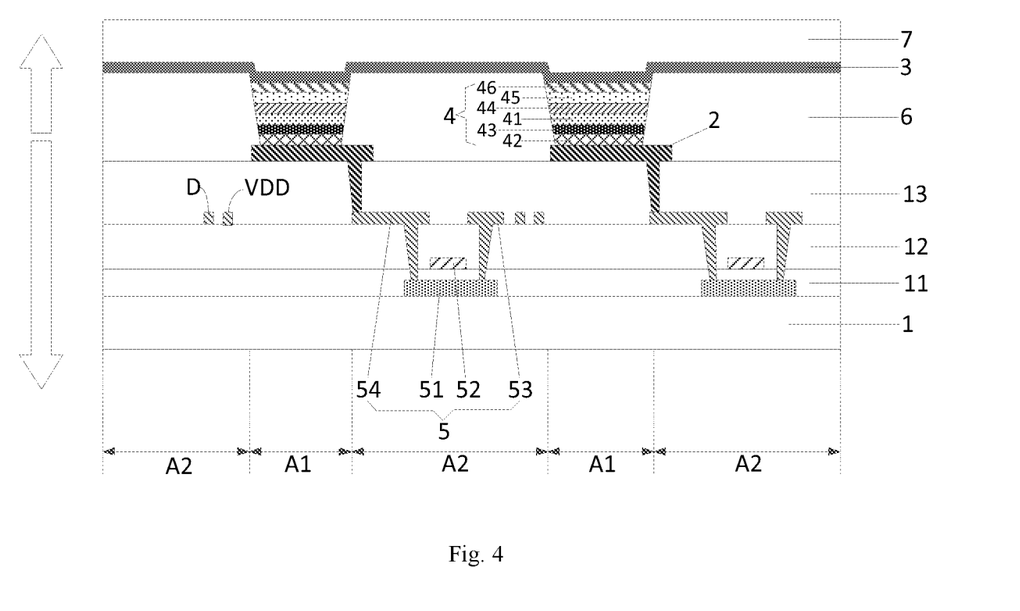
FIG. 4 is another cross-section schematic diagram along the direction CC' in FIG. 1.

During specific implementations, the above-mentioned display panel according to the embodiments of the disclosure, as shown in FIG. 4, further includes a transparent encapsulation layer 7 located on a side of the light-emitting device away from the transparent substrate 1 and covering the light-emitting device. The transparent encapsulation layer 7 is used to isolate the water vapor and oxygen, to increase the service life of the AMOLED light-emitting device and thereby increase the service life of the display panel. For example, the material of the transparent encapsulation layer 7 may be an inorganic-organic-inorganic laminated thin-film encapsulation layer.

Figure 5:
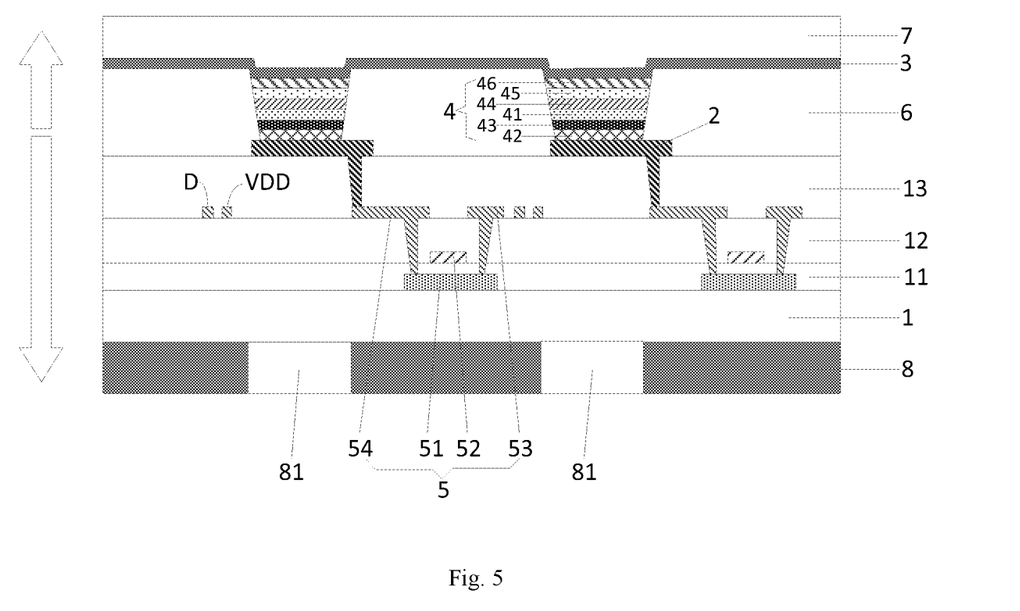
FIG. 5 is another cross-section schematic diagram along the direction CC' in FIG. 1.
Figure 6:
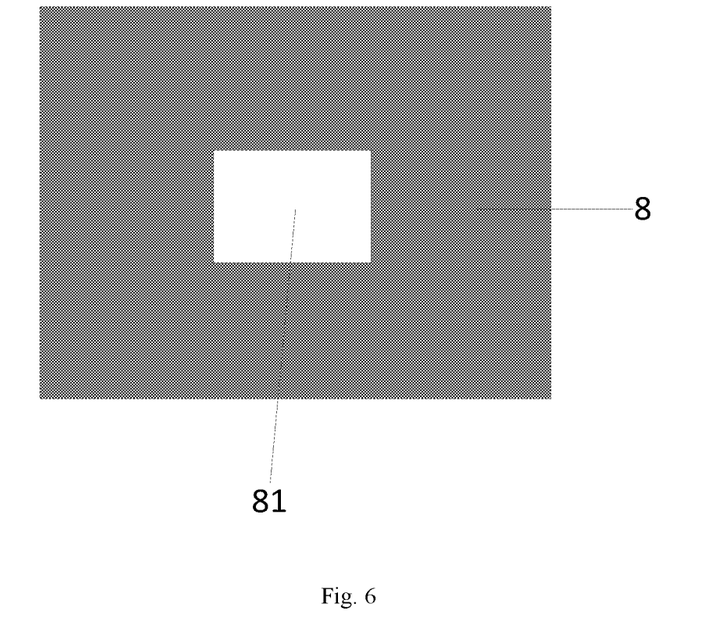
FIG. 6 is a structural schematic diagram of a top-view of the heat dissipation protective layer in FIG. 5.

For an AMOLED display panel with single-sided display, a heat dissipation protective layer (SCF) may be attached to the back side. Generally, the heat dissipation protective layer (SCF) is opaque, and the light is difficult to pass through. In order to meet the condition that the back side of the AMOLED display panel emits light, the opaque heat dissipation protective layer (SCF) attached by the normal module process is not required in the disclosure. However, in order to satisfy the display in some specific occasions, for example, when the front side of the screen of the notebook computer displays the picture normally and only a partial region of the back side displays information such as time and weather, and further, in order to support the heat dissipation function to increase the life of the display panel, the heat dissipation protective layer (SCF) may be attached to the back side of the display panel. In this way, the heat dissipation protective layer needs to be made into the required shape, for example, the middle area is hollowed out to expose the specified location where information such as time and weather needs to be displayed on the back side of the display panel. Therefore, during specific implementations, the above-mentioned display panel according to the embodiments of the disclosure, as shown in FIG. 5, further includes a heat dissipation protective layer 8 located on the side of the transparent substrate 1 away from the light-emitting device. The heat dissipation protection layer 8 has an opening area 81 corresponding to the light-emitting area A1, as shown in FIG. 6 which is a schematic diagram of a partial top-view structure of the heat dissipation protective layer 8 in FIG. 5.

The shape of the opening area 81 of the heat dissipation protective layer 8 in FIG. 5 is a square. However, during specific implementations, the shape of the opening area 81 may be designed according to the display needs, such as a circle, a polygon, etc., which is not limited here.

It should be noted that the position of the opening area 81 in FIG. 5 may also be set according to actual display needs, which is not limited here.

Further, the display panel according to the embodiments of the disclosure may further include a buffer layer between the transparent substrate and the driving structure, and may further include other functional film layers known to those skilled in the art, which are not listed here.

For the working principle of the front display, the second transparent electrode layer 3 is a common voltage, the first transparent electrode layer 2 is electrically connected to the drain 54 of the transistor (5) in the pixel circuit, and the transistor (5) transmits a signal to the first transparent electrode layer 2, so that a voltage difference is generated between the first transparent electrode layer 2 and the second transparent electrode layer 3 to excite the light-emitting part 4 to emit light. Since the first transparent electrode layer 2 and the second transparent electrode layer 3 are both transparent electrodes, the display panel can realize the double-sided display.

For the working principle of the back display, the display content is in a mirror relation with the normal (front) display. For example, when the computer is closed for standby, the front-end host automatically switches to the back display mode, and the loaded data signal is in a mirror relation with the data signal loaded in the front display.

It should be noted that the mirror relation here is only a horizontal mirror transformation of the data voltage output by the data drive circuit. Taking the central axis of the displayed image as the symmetry, the data on the left side of the central axis is transformed to the right side of the central axis, where only the position of the light-emitting sub-pixel changes, and the value is not processed. For example, during the front display, the data drive circuit outputs a data voltage corresponding to a row of pixels; and during the back display, this row of pixels can be symmetrically transformed with the central axis as the symmetry axis, and other rows of pixel data is processed in the same way until a picture is completely displayed out.

The above-mentioned display panel according to the embodiments of the disclosure realizes the double-sided visualization technology, is applied to an independent display module such as a Notebook product, and is used for the clock display (AOD) or computer manufacturer's Logo (identifier, such as DELL, ASUS, etc.) display when the notebook screen is closed for standby. Of course, the relevant display content may also be set according to the customer's preferences. The protection frame of the display screen in the display area should be hollowed out, and can replace the installation of the transparent Cover Glass (protective cover plate). For another example, the above-mentioned display panel may also be used in government windows, bank counter windows and other workplaces where workers and customers interact with each other. When a worker enters information, the display screen displays normally (front display). When a customer needs to confirm the information, the customer clicks the "customer confirmation" button on the UI interface to switch to the back display. The application of the double-sided display screen is not limited to the above occasions, and any display application expanded on this basis is the content of the disclosure.

Figure 7:
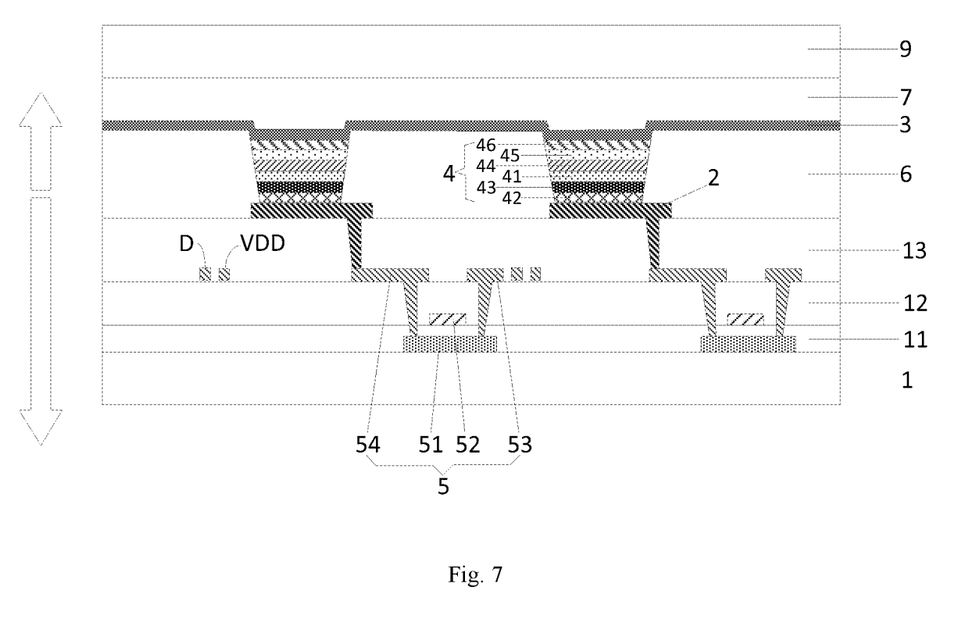
FIG. 7 is a structural schematic diagram of a display apparatus according to an embodiment of the disclosure.

Based on the same inventive concept, embodiments of the disclosure further provide a display apparatus, as shown in FIG. 7, including the above-mentioned display panel according to the embodiments of the disclosure. The principle of the display apparatus to solve the problem is similar to that of the above-mentioned display panel, so the implementations of the display apparatus can refer to the implementations of the above-mentioned display panel, and the detailed description thereof will be omitted here.

Figure 8:
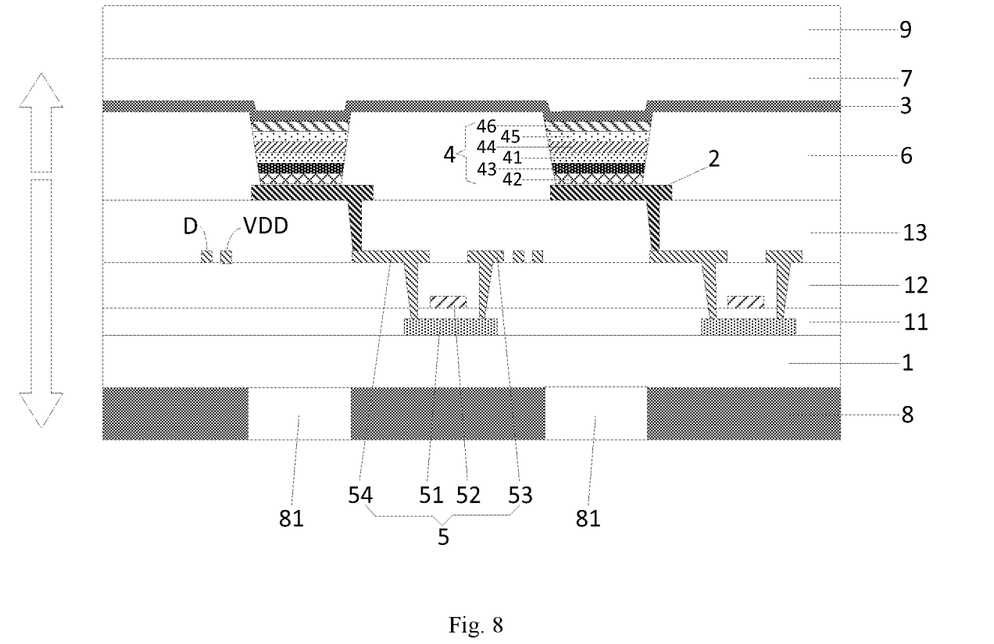
FIG. 8 is a structural schematic diagram of another display apparatus according to an embodiment of the disclosure.

During specific implementations, the above-mentioned display apparatus according to the embodiments of the disclosure, as shown in FIG. 7 and FIG. 8, further includes a transparent cover plate 9 disposed opposite to the display panel. The transparent cover plate 9 covers the above-mentioned display panel.

For example, the transparent cover plate may be a rigid cover plate or a flexible cover plate.

During specific implementations, the display apparatus may further include a circular polarizer and other functional film layers that are well known to those skilled in the art.

During specific implementations, when the display apparatus has a touch function, the display apparatus may further include a touch module.

During specific implementations, the above-mentioned display apparatus according to the embodiments of the disclosure may be a full-screen display apparatus or may be a flexible display apparatus, etc., which is not limited here.

Figure 9:
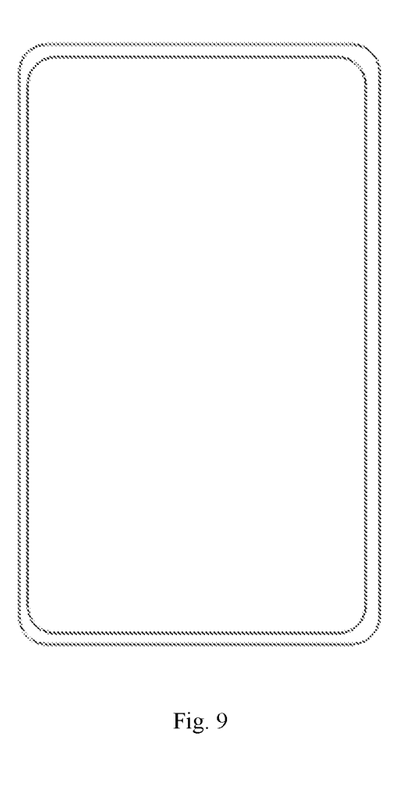
FIG. 9 is a structural schematic diagram of another display apparatus according to an embodiment of the disclosure.

During specific implementations, the above-mentioned display apparatus according to the embodiments of the disclosure may be a full-screen mobile phone as shown in FIG. 9. Further, the above-mentioned display apparatus according to the embodiments of the disclosure may also be a tablet, a television, a display, a laptop, a digital photo frame, a navigator, or any other product or component with display function. All of other indispensable components of the display apparatus should be understood by those ordinary skilled in the art to be included, and will be omitted here and should not be considered as limitations on the disclosure.

In the display panel and display apparatus according to the embodiments of the disclosure, the first transparent electrode layer and the second transparent electrode layer of the light-emitting device are both transparent electrodes, so the light-emitting device is a transparent light-emitting device, and the pixel circuit of the driving structure can control the corresponding light-emitting device to emit light to one side of the first transparent electrode layer and one side of the second transparent electrode layer respectively, so that the display panel can realize the double-sided display, that is, realize the double-sided visualization performance of the screen of the display panel, further enriching the application scenarios of the AMOLED display technology. Also, since the orthographic projections of the pixel circuits and the power supply line on the transparent substrate are all located within the orthographic projection range of the non-light-emitting area on the transparent substrate, the pixel circuits and the power supply line do not occupy the aperture ratio of the display panel, increasing the luminous brightness of the display panel.

Although the preferred embodiments of the disclosure have been described, those skilled in the art can make additional alterations and modifications to these embodiments once they learn about the basic creative concepts. Thus, the attached claims are intended to be interpreted to include the preferred embodiments as well as all the alterations and modifications falling within the scope of the disclosure.

Evidently, those skilled in the art can make various modifications and variations to the embodiments of the disclosure without departing from the spirit and scope of the embodiments of the disclosure. Thus, the disclosure is also intended to encompass these modifications and variations to the embodiments of the disclosure as long as these modifications and variations come into the scope of the claims of the disclosure and their equivalents.

What is claimed is:

1. A double-sided display panel, comprising:
a transparent substrate with a display area comprising a-light-emitting areas and a non-light-emitting area around the light-emitting area;
a light-emitting device on the transparent substrate, wherein the light-emitting device comprises a first transparent electrode layer, a light-emitting functional layer and a second transparent electrode layer arranged in sequence; the light-emitting functional layer comprises a plurality of light-emitting parts arranged in an array, and the plurality of light-emitting parts are located in the light-emitting areas;
a driving structure between the transparent substrate and the light-emitting device, wherein the driving structure comprises a plurality of pixel circuits arranged in an array and a power supply line electrically connected to the pixel circuits to provide a power voltage, the pixel circuits are configured to drive the corresponding light-emitting parts to emit light; and orthographic projections of the pixel circuits and the power supply line on the transparent substrate are all located within an orthographic projection of the non-light-emitting area on the transparent substrate; wherein the driving structure further comprises: a gate line and a data line, the gate line and the data line intersect with each other to form a mesh structure, the mesh structure is provided with a plurality of mesh holes, and orthographic projections of the light-emitting areas on the transparent substrate are located in orthographic projections of the mesh holes on the transparent substrate; the power supply line and the data line are arranged crosswise, and the power supply line and the gate line are arranged in a same layer; and
a heat dissipation protective layer on a side of the transparent substrate facing away from the light-emitting device; wherein the heat dissipation protective layer is provided with opening areas corresponding to the light-emitting areas.

2. The display panel of claim 1, wherein:
the first transparent electrode layer is a fully-transparent or semi-transparent electrode layer; and
the second transparent electrode layer is a fully-transparent or semi-transparent electrode layer.

3. The display panel of claim 2, wherein:
material of the first transparent electrode layer comprises Indium Tin Oxide (ITO), Indium Zinc Oxide (IZO), Indium Gallium Oxide (IGO), Gallium Zinc Oxide (GZO), Zinc Oxide (ZnO), Indium Oxide (In2O3), Aluminum Zinc Oxide (AZO) or carbon nanotube; and
material of the second transparent electrode layer comprises Indium Tin Oxide (ITO), Indium Zinc Oxide (IZO), Indium Gallium Oxide (IGO), Gallium Zinc Oxide (GZO), Zinc Oxide (ZnO), Indium Oxide (In2O3), Aluminum Zinc Oxide (AZO) or carbon nanotube.

4. The display panel of claim 1, further comprising a pixel defining layer with pixel openings in a one-to-one correspondence to the light-emitting areas, wherein the orthographic projections of the pixel circuits and the power supply line on the transparent substrate are all located within an orthographic projection of the pixel defining layer on the transparent substrate.

5. The display panel of claim 1, wherein the first transparent electrode layer is between the driving structure and the light-emitting functional layer, the first transparent electrode layer is an anode layer, and the second transparent electrode layer is a cathode layer;
the light-emitting part comprises: a light-emitting layer, at least one of a hole injection layer and a hole transport layer between the first transparent electrode layer and the light-emitting layer, and at least one of a hole blocking layer, an electron transport layer and an electron injection layer between the light-emitting layer and the second transparent electrode layer.

6. The display panel of claim 5, wherein a transmittance of the first transparent electrode layer is 88%-94%, a transmittance of the second transparent electrode layer is 88%-94%, a transmittance of the electron injection layer is 80%-92%, a transmittance of the electron transport layer is 80%-92%, a transmittance of the hole blocking layer is 75%-90%, a transmittance of the hole transport layer is 75%-90%, and a transmittance of the hole injection layer is 75%-90%.

7. The display panel of claim 1, wherein the transparent substrate is a glass substrate or a plastic substrate.

8. The display panel of claim 1, further comprising a transparent encapsulation layer, located on a side of the light-emitting device away from the transparent substrate and covering the light-emitting device.

9. A display apparatus, comprising the display panel according to claim 1.

10. The display apparatus of claim 9, further comprising a transparent cover plate disposed opposite to the display panel, wherein the transparent cover plate covers the display panel.

11. The display panel of claim 1, wherein the pixel circuit comprises a switch transistor and a drive transistor, the gate line and the data line are both electrically connected to the corresponding switch transistor, and the power supply line is electrically connected to the drive transistor;
each of the switch transistor and the drive transistor comprises a gate layer and a source-drain layer, the gate line is located in the gate layer, and the data line is located in the source-drain layer.

* * * * *